United States Patent
Bock et al.

(10) Patent No.: US 7,256,472 B2
(45) Date of Patent: Aug. 14, 2007

(54) BIPOLAR TRANSISTOR

(75) Inventors: Josef Bock, Munich (DE); Thomas Meister, Taufkirchen (DE); Andriy Romanyuk, Schliersee (DE); Herbert Schäfer, Hohenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/521,106

(22) PCT Filed: Jul. 11, 2003

(86) PCT No.: PCT/EP03/07553

§ 371 (c)(1),
(2), (4) Date: Sep. 13, 2005

(87) PCT Pub. No.: WO2004/008543

PCT Pub. Date: Jan. 22, 2004

(65) Prior Publication Data

US 2006/0097352 A1    May 11, 2006

(30) Foreign Application Priority Data

Jul. 11, 2002   (DE) ............................... 102 31 407

(51) Int. Cl.
*H01L 31/11* (2006.01)

(52) U.S. Cl. .................. 257/588; 257/584; 257/591

(58) Field of Classification Search ................ 257/588, 257/584, 591
See application file for complete search history.

(56) References Cited

U.S. PATENT DOCUMENTS

| | | | |
|---|---|---|---|
| 4,437,897 A | 3/1984 | Kemlage | |
| 5,049,964 A | 9/1991 | Sakai et al. | |
| 5,407,857 A * | 4/1995 | Higuchi | 438/309 |
| 5,471,085 A * | 11/1995 | Ishigaki et al. | 257/370 |
| 5,541,444 A | 7/1996 | Ohmi et al. | |
| 5,821,157 A | 10/1998 | Lee et al. | |
| 5,847,411 A * | 12/1998 | Morii | 257/64 |
| 6,521,974 B1 * | 2/2003 | Oda et al. | 257/593 |
| 6,593,640 B1 * | 7/2003 | Kalnitsky et al. | 257/565 |
| 6,642,553 B1 | 11/2003 | Drews et al. | |
| 6,682,992 B2 * | 1/2004 | Geiss et al. | 438/488 |
| 6,740,560 B1 | 5/2004 | Heinemann et al. | |
| 6,800,881 B2 | 10/2004 | Lippert et al. | |

FOREIGN PATENT DOCUMENTS

| | | |
|---|---|---|
| EP | 0 535 350 | 8/1992 |
| EP | 0 646 952 | 4/1995 |
| WO | 00/13206 | 8/1999 |
| WO | 2004/008543 | 1/2004 |

OTHER PUBLICATIONS

Lurng Shehng Lee et al., "Argon Ion-Implantation on Polysilicon or Amorphous-Silicon for Boron Penetration Suppression in p+p MOSFET" Aug. 1998, IEEE Transactions on Electron Devices, pp. 1737-1744.
Ning, Tak H., "Self-Aligned Bipolar Transistor for High-Performance and Low-Power-Delay VLSI," IEEE Transactions on Electron Devices, vol. ED-28, No. 9, pp. 1010-1013 (Sep. 1981).

* cited by examiner

*Primary Examiner*—Sara Crane
(74) *Attorney, Agent, or Firm*—Dicke, Billig & Czaja, PLLC

(57) ABSTRACT

A bipolar transistor and method of making a bipolar transistor is disclosed. In one embodiment, the bipolar transistor includes a polysilicon layer into which impurity atoms are inserted, thereby reducing the layer resistance.

11 Claims, 1 Drawing Sheet

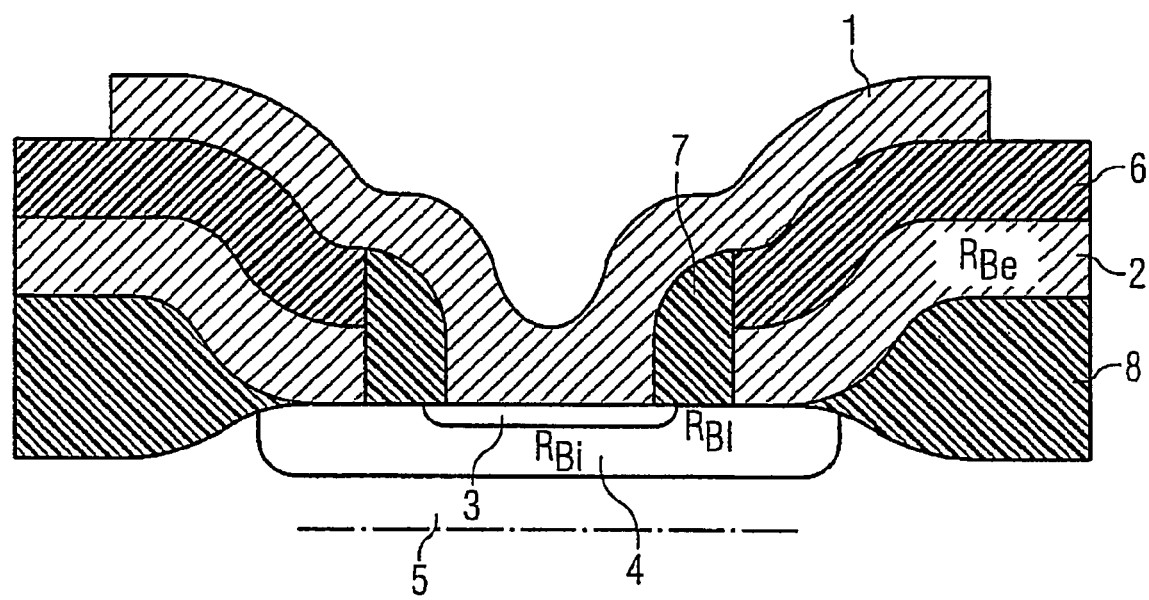

BIPOLAR TRANSISTOR

CROSS REFERENCE TO RELATED APPLICATION

This Utility Patent Application claims the benefit of the filing date of Application No. DE 102 31 407.1, filed Jul. 11, 2002 and International Application No. PCT/EP2003/007553, filed Jul. 11, 2003, both of which are herein incorporated by reference.

FIELD OF THE INVENTION

This invention concerns a bipolar transistor which can be, in particular, in the form of a self-aligned bipolar transistor.

BACKGROUND

In the case of bipolar transistors, the extrinsic base resistance, with the transition frequency and base collector capacitance, is one of the decisive transistor parameters which determine important characteristic quantities such as the maximum oscillation frequency, the amplification ("gain"), the minimum noise factor, gate delay times, etc. of the bipolar transistor. The extrinsic base resistance corresponds to the resistance between the base, or the actual base area, and an external contact, which is connected to the base via a connecting line.

Regarding the above-mentioned transistor parameters, the following applies, for instance, to the maximum oscillation frequency $f_{max}$ of the bipolar transistor:

$$f_{max} \approx \sqrt{\frac{f_T}{8\pi \cdot R_B \cdot C_{BC}}} \quad (1)$$

where $f_T$ is the transition frequency, $R_B$ is the extrinsic base resistance and $C_{BC}$ is the base collector capacitance of the bipolar transistor.

For the minimum noise factor $F_{min}$ of a bipolar transistor, the following applies, depending on the extrinsic base resistance $R_B$ and frequency $f$:

$$F_{min} \approx 1 + \frac{1}{\beta} + \frac{f}{F_T} \cdot \sqrt{\frac{2 \cdot I_C}{V_T} \cdot R_B \cdot \left(1 + \frac{f_T^2}{\beta \cdot f^2}\right) + \frac{f_T^2}{\beta \cdot f^2}} \quad (2)$$

where $\beta$ is the small signal current amplification, $I_C$ is the collector current, and $V_T$ is the thermal voltage of the bipolar transistor.

From the two formulae (1) and (2), it can be seen that the extrinsic base resistance $R_B$ should be small for fast switching and low noise factors. One method of reducing losses in the case of bipolar transistors is the use of a polysilicon electrode for contacting the base. A $p^+$ polysilicon layer provides a low-resistance path with correspondingly low capacitance for the base current.

Specially small extrinsic base resistances can be achieved, for instance, by use of the concept of the so-called "self-aligned double polysilicon bipolar transistor", as described in "Self-Aligned Bipolar Transistors for High-Performance and Low-Power-Delay VLSI", T. H. Ning et al., IEEE Transactions on Electron Devices, Vol. ED-28, No. 9, pp. 1010-1013, 1981. This concept is therefore used in almost all widely used production technologies for ultra-high frequency bipolar transistors.

SUMMARY

The present invention provides a bipolar transistor. Embodiments of the invention provide a bipolar transistor and method of making a bipolar transistor. In one embodiment, the invention provides a bipolar transistor having a polysilicon layer into which impurity atoms are inserted, thereby reducing the layer resistance.

In the attached FIG. 1, such a self-aligned npn double polysilicon bipolar transistor is shown in cross-section. The emitter 3 is contacted via an n+ doped polysilicon electrode 1. A p+ polysilicon electrode 2 is assigned to the p+ doped base 4. The self-aligned emitter base insulation 7 is called the "spacers". Additionally, under the emitter electrode 3 a TEOS ("tetraethoxysilan/tetraethylorthosilicate") insulation layer 6 is provided, and under the base electrode 2 a LOCOS ("local oxidation of silicon") insulation layer 8 is provided. In the figure, the collector area 5 of the bipolar transistor (without the associated collector electrode) is also shown by a dashed line. A method of producing such a bipolar transistor is described, for instance, in EP-B1-0 535 350.

In the case of a self-aligned double polysilicon bipolar transistor such as is shown in the figure, the extrinsic base resistance $R_B$ consists essentially of three parts, which are called below the "internal" resistance part $R_{Bi}$, the "external" resistance part $R_{Be}$, and the "link" resistance part $R_{Bl}$. The internal resistance part $R_{Bi}$ results from the resistance in the base area 4 on the active transistor area. The external resistance part $R_{Be}$ describes the resistance of the polysilicon base electrode 2, which leads to the external base contact. The link resistance part $R_{Bl}$ represents the extrinsic base resistance which results from the low-doped zone under the self-aligned emitter base insulation, the spacers 7.

In today's bipolar transistors, the total extrinsic base resistance $R_B$ is usually dominated by the sum of the internal resistance part $R_{Bi}$ and the link resistance part $R_{Bl}$. Because of progressing lateral scaling of the components, the internal resistance part $R_{Bi}$ and the link resistance part $R_{Bl}$ are continually being reduced. Simultaneously, the external resistance part $R_{Be}$ is constantly increasing, because the vertical component scaling which is linked to the lateral scaling requires ever thinner polysilicon layers as connecting electrodes, and the layer resistance of these connecting areas is thus constantly increasing. Thus the external resistance part $R_{Be}$ is becoming ever more important for the total extrinsic base resistance $R_B$.

To keep the layer resistance of the base electrode 2 as small as possible, in general polysilicon layers doped with boron are used. The boron doping is chosen to be above the electrically activatable concentration of typically greater than $5 \times 10^{20}$ cm$^{-3}$, to achieve the smallest possible layer resistance. The boron doping atom is chosen because of the consideration that boron has little or no effect on the grain growth, and does not tend to separate at the grain boundaries during thermal processing events. The model of doping material separation assumes that the conductivity is controlled by separation of doping atoms at the grain boundaries, where the atoms are themselves captured and become electrically inactive. Additionally, a high doping material concentration at the grain boundaries suppresses grain growth during annealing. Redistribution of implanted doping materials and greater grain sizes during subsequent annealing steps change the electrical and structural properties of the layers, which clearly affects the external resistance part $R_{Be}$ of the extrinsic base resistance $R_B$. The main problem is the annealing behaviour of Si samples with doping atoms. In fact, only a small proportion of the doping atoms, about 10%, is ionised. It is assumed that inactive, non-eliminated doping atoms are present in cluster form. Cluster formation of the doping atoms takes place at the annealing temperature, or alternatively mainly during cooling of the sample. With typical doping values of boron greater than $5 \times 10^{20}$ cm$^{-3}$ and a layer thickness of 150-250 nm, minimum layer resistances of about 50-100 Ω/□ can be achieved.

BRIEF DESCRIPTION OF THE DRAWINGS

The invention is explained in more detail below, referring to the only FIGURE of a preferred embodiment.

FIG. 1 is a cross-section illustrating one exemplary embodiment of a bipolar transistor according to the invention.

DETAILED DESCRIPTION

The present invention provides a bipolar transistor in which the layer resistance of the connecting electrodes, particularly the base electrode, is further reduced.

According to one embodiment of the invention, it is proposed that in bipolar transistors, instead of traditional polysilicon electrodes, polysilicon layers into which impurity atoms are inserted should be used. These cause a high density of vacancies in the electrode material.

As impurity atoms, preferably C, P or Ar atoms are used, C atoms being specially preferred. The density of the impurity atoms in the polysilicon layer is preferably in the range of about $10^{19}$-$10^{21}$ cm$^{-3}$.

Carbon with high solubility in silicon can be built into the silicon lattice at the interstices and also at the more favourable (in energy terms) lattice sites, in exchange for a Si atom. The C atoms at the lattice sites capture Si atoms which are present at interstices, and thus form bound interstitial complexes. Because of this capturing mechanism of the C atoms, additional vacancies are generated. The carbon in the polysilicon layer therefore provides sinks for interstices during annealing, so that interstice-driven cluster formation of, for instance, boron doping atoms is suppressed, and thus the quantity and concentration of active doping atoms can be increased. This results in a lower layer resistance of the polysilicon layer which is doped with, for instance, boron, and thus to a smaller extrinsic base resistance. This effect can be further increased by the use of polysilicon layers of polycrystalline silicon-germanium.

Since carbon is in general use in semiconductor technology, and can be inserted into the polysilicon layer of the electrodes both directly during layer growth and by ion implantation, the concept of the invention, as described above, can be implemented simply and economically in manufacturing methods for traditional bipolar transistors.

A further advantage is that C atoms can be built in without essentially interfering with the Si lattice structure, since the volume of even SiC is only about 3% greater than that of pure Si.

Although this invention refers in particular to bipolar transistors, in principle use with other transistor types such as FET, MOS or CMOS transistors is also conceivable.

The emitter 3 of the bipolar transistor is contacted via an n+ doped polysilicon electrode 1, and a p+ polysilicon electrode 2 is assigned to the p+ doped base 4. Spacers 7 are provided as the self-aligned emitter base insulation. Additionally, under the emitter electrode 1 a TEOS insulation layer 6 is provided, and under the base electrode 2 a LOCOS insulation layer 8 is provided. In FIG. 1, the collector area 5 of the bipolar transistor is also illustrated by a dashed line.

As the base electrode 2, a polysilicon layer, into which C impurity atoms are inserted with a concentration of $10^{19}$-$10^{21}$ cm$^{-3}$, is used. This can be done either by ion implantation or alternatively directly during layer growth, without an additional implantation step. Additionally, as already known, the polysilicon layer is doped with boron atoms at a concentration of greater than $5 \times 10^{20}$ cm$^{-3}$.

The C impurity atoms incorporate themselves into the Si lattice at interstices and preferably at the more favourable (in energy terms) lattice sites. The C impurity atoms on the lattice sites capture Si atoms from interstices and form bound interstitial complexes. Because of these captured Si atoms, additional vacancies are formed, with an estimated density of about $10^{19}$ cm$^{-3}$. The Si—C agglomerates which are formed in this way are stable to about 700° C. At higher temperatures, they are converted to β SiC. The volume of SiC, which is greater by about 3% compared with the Si matrix, can also easily be compensated for by vacancies, so that no undesired voltages occur in the electrodes. In this way, during annealing, the carbon generates sinks for interstices in the polysilicon layer, so that interstice-driven cluster formation of the boron doping atoms is suppressed and thus the quantity of active doping atoms can be increased.

The higher concentration of active doping atoms which is generated in this way results in a lower layer resistance of the polysilicon layer, which is doped with boron, and thus to a smaller extrinsic base resistance. This effect can be further increased by the use of polysilicon layers of polycrystalline silicon-germanium.

Obviously, alternatively or additionally to the base electrode 2, the emitter electrode 1 and the collector electrode can be in the form according to the invention.

The invention claimed is:

1. A bipolar transistor comprising:
an emitter area which can be contacted electrically via an emitter electrode;
a base area which can be contacted electrically via a base electrode;
a collector area which can be contacted electrically via a collector electrode; and
wherein at least one electrode of the emitter electrode, base electrode and collector electrode is a polysilicon layer, into which doping is inserted and impurity atoms are inserted, wherein the inserting of the impurity atoms causes a high density of vacancies in the polysilicon layer, the density in the range of about $10^{19}$ to $10^{21}$ cm$^{-3}$, wherein the impurity atoms are C, P or Ar atoms and wherein the combination of the inserted doping and inserted impurity atoms is such that the electrode resistance is reduced.

2. The transistor of claim 1, comprising wherein the polysilicon layer is doped with boron atoms.

3. The transistor of claim 2, comprising wherein the concentration of the boron atoms is greater than $5 \times 10^{20}$ cm$^{-3}$.

4. The transistor of claim 1, comprising wherein the at least one electrode consists of polycrystalline silicon-germanium.

5. The transistor of claim 1, comprising wherein the at least one electrode is the base electrode.

6. The transistor of claim 1, comprising wherein the bipolar transistor is a self-aligned bipolar transistor.

7. A bipolar transistor comprising:

an emitter area which can be contacted electrically via an emitter electrode;

a base area which can be contacted electrically via a base electrode;

a collector area which can be contacted electrically via a collector electrode; and wherein at least one electrode of the emitter electrode, base electrode and collector electrode is a polysilicon layer doped with boron atoms, into which impurity atoms, which cause a high density of vacancies in the polysilicon layer, are inserted, wherein the impurity atoms are C, P or Ar atoms;

wherein the density of the impurity atoms in the polysilicon layer is in the range of about $10^{19}$ to $10^{21}$ cm$^{-3}$; and wherein the concentration of the boron atoms is greater than $5\times10^{20}$ cm$^{-3}$.

8. The transistor of claim 7, comprising wherein the at least one electrode consists of polycrystalline silicon-germanium.

9. The transistor of claim 8, comprising wherein the at least one electrode is the base electrode.

10. The transistor of claim 9, comprising wherein the bipolar transistor is a self-aligned bipolar transistor.

11. A bipolar transistor comprising:

an emitter area which can be contacted electrically via an emitter electrode;

a base area which can be contacted electrically via a base electrode;

a collector area which can be contacted electrically via a collector electrode;

wherein a polysilicon layer is used as the base electrode;

wherein the extrinsic base resistance of the base electrode is reduced by inserting impurity C atoms into the polysilicon layer, thereby causes a high density of vacancies in the polysilicon layer; and wherein doping is inserted in the polysilicon layer.

* * * * *